United States Patent [19]
Chan et al.

[11] Patent Number: 6,002,604
[45] Date of Patent: Dec. 14, 1999

[54] SMART FIVE VOLT GENERATOR OPERABLE FROM DIFFERENT POWER SUPPLY VOLTAGES

[75] Inventors: Julia Shau-Chang Chan, Saratoga; Chao-Hung Chang, Santa Clara; Paul Jei-Zen Song, Sunnyvale, all of Calif.

[73] Assignee: Integrated Silicon Solution, Inc., Santa Clara, Calif.

[21] Appl. No.: 08/968,699

[22] Filed: Nov. 10, 1997

[51] Int. Cl.$^6$ .............................. H02M 1/10; G11C 13/00
[52] U.S. Cl. .......................... 363/142; 365/228; 323/314
[58] Field of Search .............................. 363/142; 323/312, 323/313, 314; 365/226, 227, 189.09, 228, 229, 189.07; 307/44, 60, 80, 85; 327/63, 540, 545

[56] References Cited

U.S. PATENT DOCUMENTS

| | | | |
|---|---|---|---|
| 4,617,473 | 10/1986 | Bingham | 327/63 X |
| 5,272,393 | 12/1993 | Horiguchi et al. | 327/63 X |
| 5,483,152 | 1/1996 | Hardee et al. | 323/314 |
| 5,663,918 | 9/1997 | Javanifard et al. | 365/226 |

*Primary Examiner*—Y. J. Han
*Attorney, Agent, or Firm*—Pennie & Edmonds LLP

[57] ABSTRACT

A 5V generator circuit is disclosed that generates a reliable 5V signal for use in integrated circuits from the available VPP or VCC supplies for a wide range of VPP and VCC voltages. When VCC is greater than approximately 4V, the generator circuit generates the 5V signal directly from VCC. When VCC is less than approximately 4V and VPP is greater than approximately 4V but less than about 9V, the generator circuit generates the 5V signal directly from VPP. When VCC is less than approximately 4V and VPP is greater than approximately 9V, the generator produces the 5V signal at approximately half of the voltage level of the VPP signal. When both VCC and VPP are less than about 4V, the 5V signal is generated at the too-low VCC level.

11 Claims, 7 Drawing Sheets

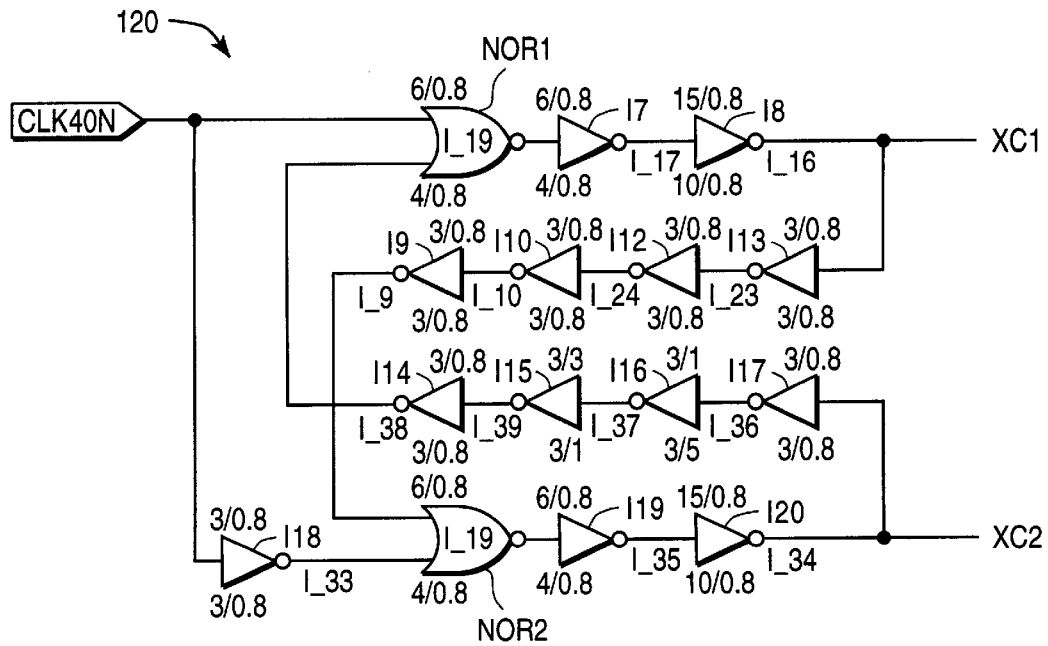
VPPON = VPP + 2*0.9*VCC − 2 VTZ = VPP + 1.8 VCC − 3VTZ − 6 −> 7 Volt
FIG. 4A   LOCAL VPP SWITCH
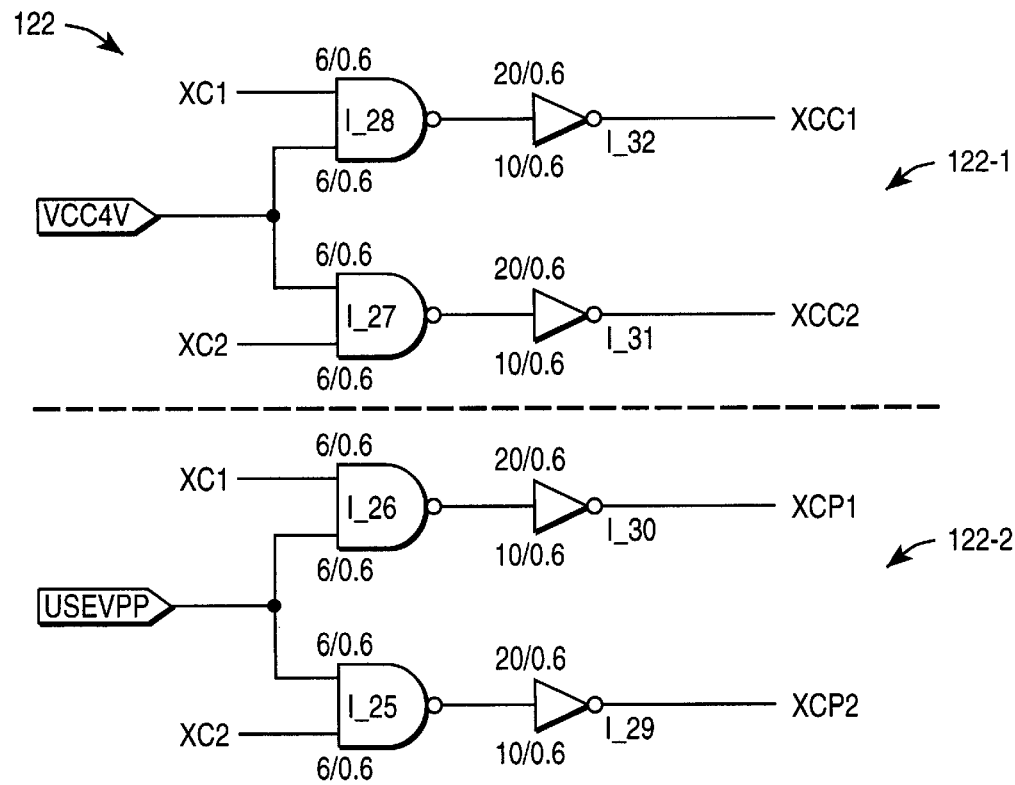
VPPON = VPP + 2*0.9*VCC − 2 VTZ = VPP + 1.8 VCC − 3VTZ − 6 −> 7 Volt
FIG. 4B   LOCAL VPP SWITCH

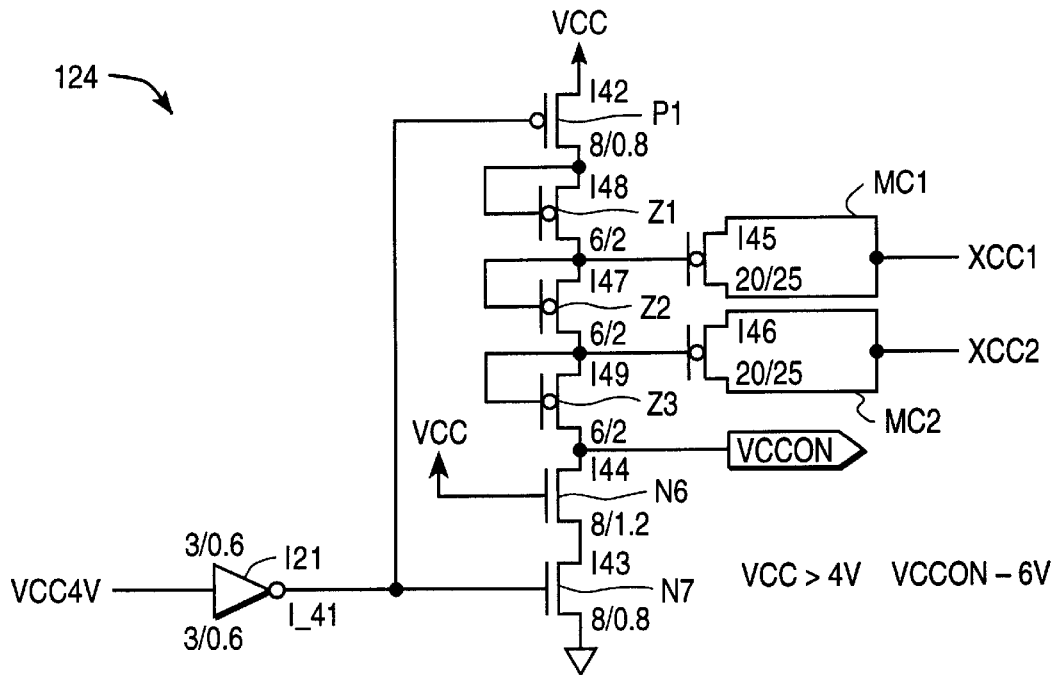
VPPON = VPP + 2*0.9*VCC – 2 VTZ = VPP + 1.8 VCC – 3VTZ – 6 –> 7 Volt
FIG. 4C  LOCAL VPP SWITCH
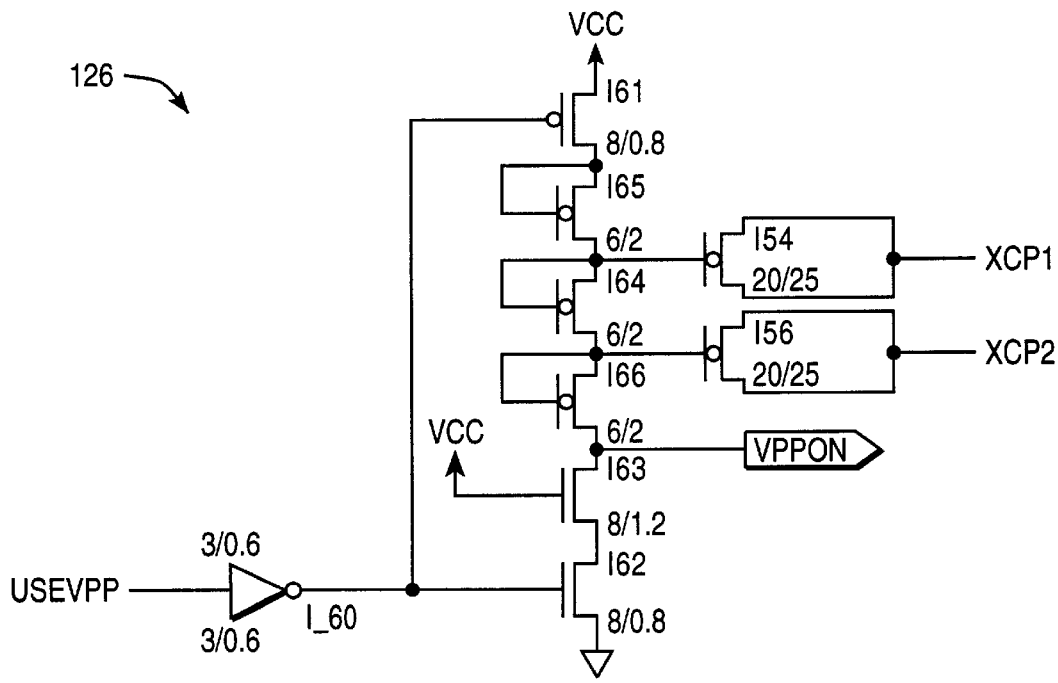
VPPON = VPP + 2*0.9*VCC – 2 VTZ = VPP + 1.8 VCC – 3VTZ – 6 –> 7 Volt
FIG. 4D  LOCAL VPP SWITCH

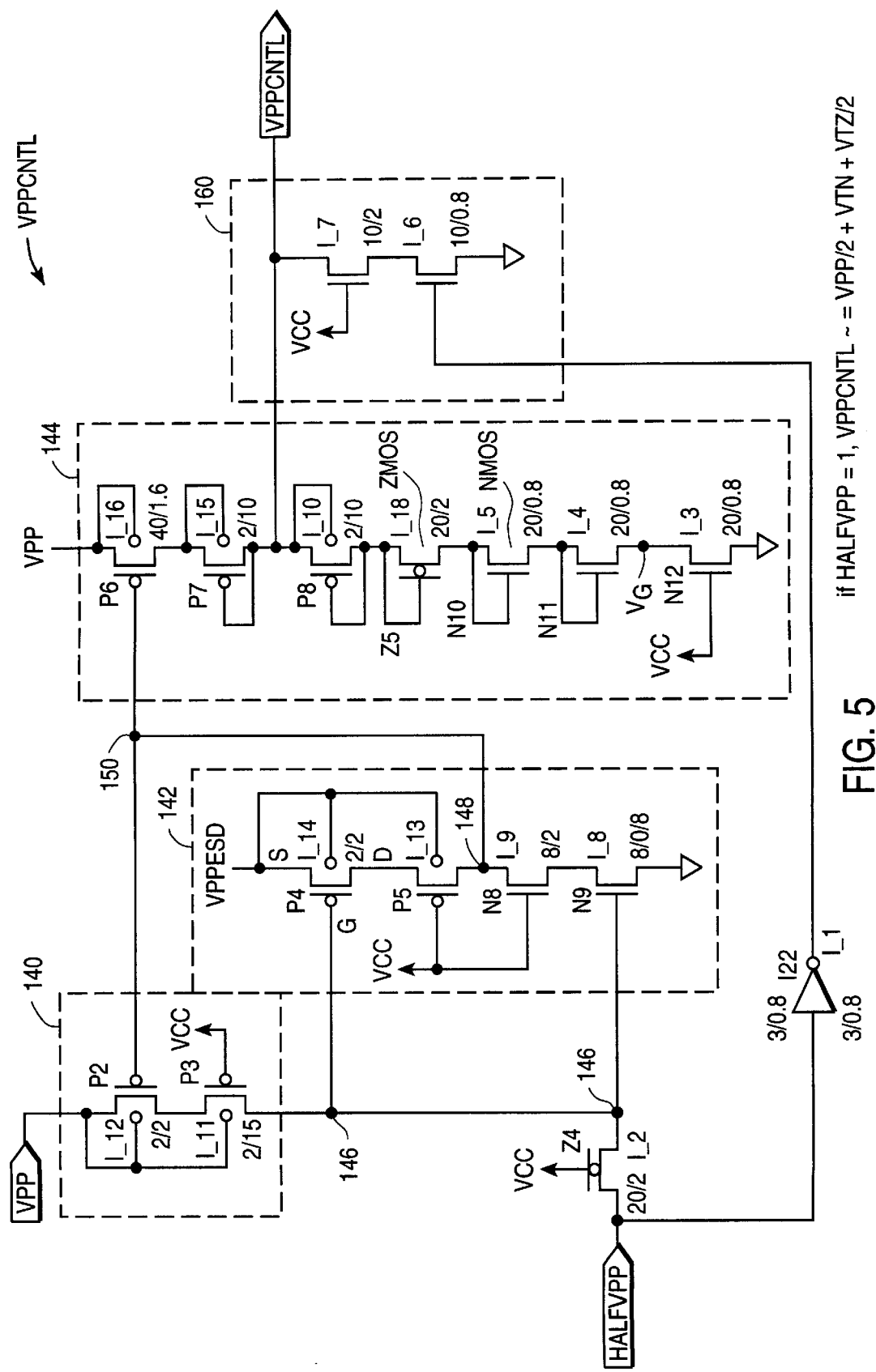

SMART FIVE VOLT GENERATOR OPERABLE FROM DIFFERENT POWER SUPPLY VOLTAGES

The present invention relates generally to integrated circuits and, particularly, to circuits that generate fixed power supply voltages for integrated circuits.

BACKGROUND OF THE INVENTION

Typically, many types of integrated circuits, including non-volatile semiconductor memories such as EPROM, flash EPROM and EEPROM, are designed to operate from a 5 volt (5V) power supply. However, due to the distinct needs of the products that employ integrated circuits, the external power voltage levels supplied to the integrated circuits often have different level. For example, one product for use with a non-volatile memory might supply a positive high voltage (Vpp) of approximately 12V±10% and another product a Vpp of approximately 5V±10%. Similarly, different products might provide Vcc levels of 5V±10% and 3V±10%, respectively.

To accommodate different external power voltage levels, integrated circuit manufacturers include with their chips on-board 5V generator circuits that convert predetermined supply voltages likely to be available to 5V signals. For example, existing on-board 5V generators for flash memories and EEPROMs generate 5V signals from the VPP or VCC signals provided by the programmable electronic devices that employ those chips. However, VPP and VCC signal levels can vary greatly: VPP can be between 5V±10% and 12V±10%, and VCC can be as low as 2.7V. Consequently, chip manufacturers must provide different versions of the chip, each distinguished by a unique 5V generator circuit designed to generate a reliable 5V signal level from a particular VPP or VCC signal level. Moreover, even given a large library of different 5V generator designs, it is possible that none of those designs are compatible with the VCC and VPP levels provided by a particular system environment

SUMMARY OF THE INVENTION

In summary, the present invention is a smart 5V generator that generates a reliable 5V signal from an available VCC or VPP power supply signal for a wide range of VCC or VPP signal levels. In the preferred embodiment, the present invention is operable with power supplies having VCC levels between 2.7V and 5.5V and VPP levels between 10.8V and 13.2V or between 4.5V and 5.5V. The present invention provides circuitry that senses the voltage levels of the available VPP and VCC signals. Depending on the levels of those signals, the present invention uses either the VPP or the VCC signal to generate the 5V signal. The teachings of the present invention are applicable to any integrated circuit that might be used with different power supply voltages and can be used to generate a variety of reliable signal levels from the different power supply voltages.

In particular, the smart 5V generator includes a detection circuit that performs the following comparisons to detect the level of the VPP and VCC signals. The outcome of each comparison is indicated by a respective signal:

(1) if VCC is greater than 4V, then a VCC4V signal is asserted;
(2) if VPP is greater than 4V, then a VPP4V signal is asserted; and
(3) if VPP is greater than 9V, then a VPP9V signal is asserted.

A decoder circuit decodes the VCC4V, VPP4V and VPP9V signals to determine as follows which of the power supplies to use to generate the 5V signal:

(1) if VCC is not greater than 4V and VPP is greater than 9V, then a HALFVPP signal is asserted, indicating that the 5V supply should be generated from half of VPP;
(2) if VCC is not greater than 4V, VPP is not greater than 9V and VPP is greater than 4V, then a USEVPP signal is asserted, indicating that the 5V supply should be generated directly from VPP;
(3) if VCC is greater than 4V, then the 5V supply is generated directly from VCC; and
(4) if none of the VCC4V, VPP4V and VPP9V signals are asserted, then an ERRVPP signal is asserted, indicating that both VCC and VPP are smaller than 4V and that no 5V supply will be generated.

The USEVPP and VCC4V signals are coupled to a pump module which, if the USEVPP or VCC4V signals are asserted, pumps the corresponding power supply signal to above 7V. For example, if the USEVPP signal is high, then a pumped VPPON signal is provided that is higher than 7V. If the VCC4V signal is high, then a pumped VCCON signal is provided that is higher than 7V. Each pumped signal is generated by a respective pump circuit that is driven by a two phase clock.

The HALFVPP signal is coupled to a VPPCNTL module that includes a transistor-based voltage divider that generates an output power signal VPPCNTL that is approximately half of the VPP signal level.

The VPPCNTL, VCCON and VPPON signals are coupled to a switch that generates the desired 5V output from whichever of the input signals are asserted. Due to the structure of the switch:

(1) When VCCON is used, the 5V output is approximately equal to VCC (because VCCON is much higher than VCC);
(2) When VPPON is used, the 5V output is approximately equal to VPP (because VPPON is much higher than VPP); and
(3) When VPPCNTL is used, the 5V output is established at VPPCNTL minus a transistor threshold voltage.

BRIEF DESCRIPTION OF THE DRAWINGS

Additional objects and features of the invention will be more readily apparent from the following detailed description and appended claims when taken in conjunction with the drawings, in which:

FIG. 4A is a circuit schematic of a portion of the charge pump block (VCCVPPON) of FIG. 1 that generates a two phase clock consisting of the signals XC1 and XC2;

FIG. 4B is a circuit schematic of a portion of the VCCVPPON block that generates two sets of two phase clock signals XCC1 and XCC2, and XCP1 and XCP2;

FIG. 4C is a circuit schematic of a charge pump circuit within the VCCVPPON block that pumps a VCCON signal to higher than 7V for generating the 5V output signal;

FIG. 4D is a circuit schematic of a charge pump circuit within the VCCVPPON block that pumps a VPPON signal to higher than 7V for generating the 5V output signal;

FIG. 5 is a circuit schematic of the VPP control block (VPPCNTL) of FIG. 1 that generates the 5V signal from half of VPP if HALFVPP is asserted.

DESCRIPTION OF THE PREFERRED EMBODIMENT

Figure 1:
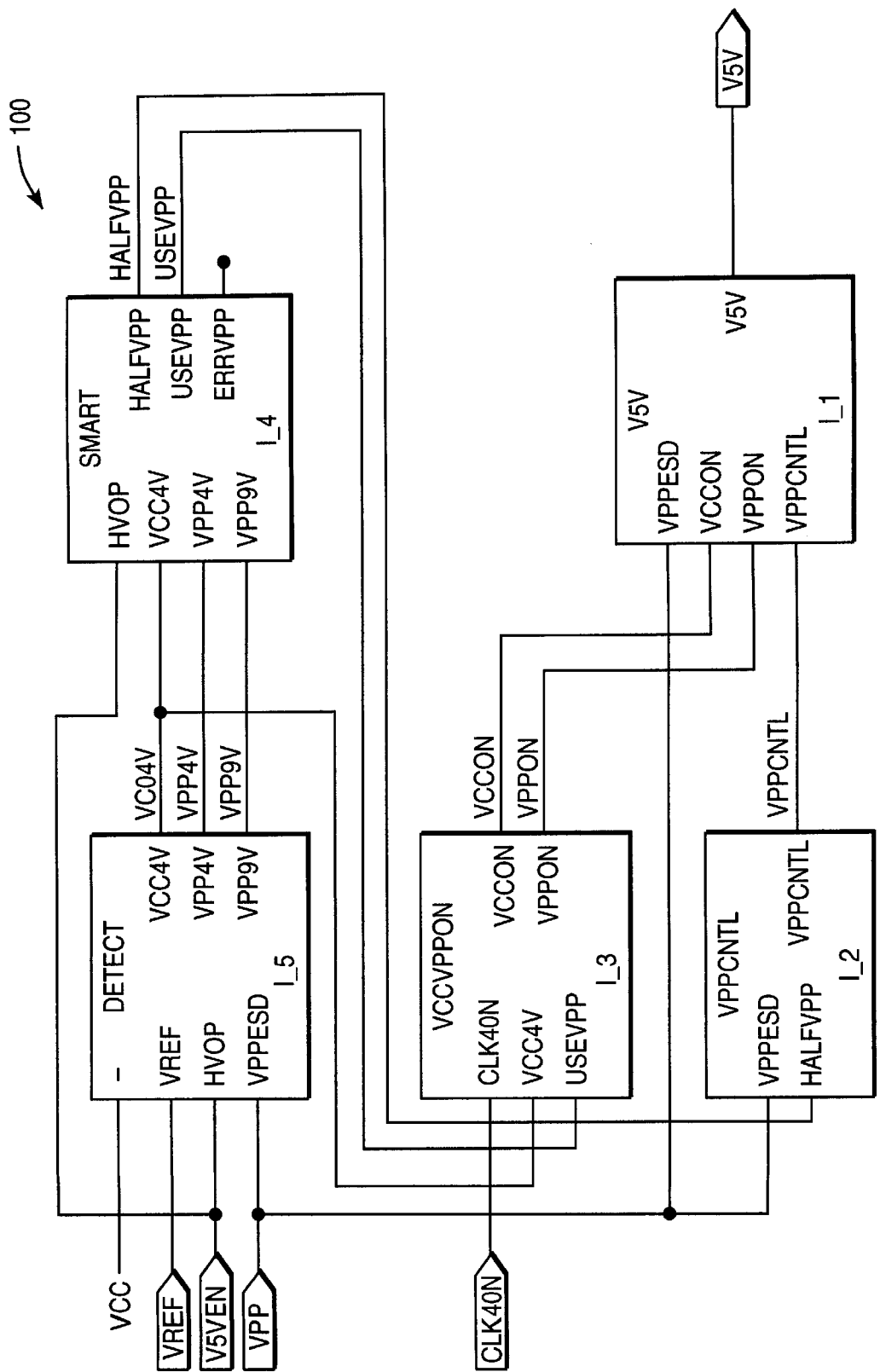
FIG. 1 is a block diagram of a preferred embodiment of the smart 5V generator.

Referring to FIG. 1, there is shown a block diagram of a preferred embodiment of the present invention. The smart 5V generator 100 shown therein includes a VCC/VPP detector (DETECT), a smart voltage decoder (SMART), a VCC/VPP charge pump (VCCVPPON), a VPP control circuit (VPPCNTL) and an output switch (V5V). Inputs to the 5V generator 100 include VCC and VPP power supply signals, an enable signal V5VEN, a voltage reference signal VREF and a clock control signal CLK40N. The 5V generator provides a single output signal V5V at approximately 5V when possible from either VCC or VPP.

The DETECT circuit detects the level of the VPP and VCC signals by performing a series of comparisons in parallel using as the comparison voltage reference the VREF signal, which is derived from a bandgap reference at 1.28V. The outcome of each comparison is indicated by a respective signal as follows:

(1) if VCC is greater than 4V, then the VCC4V signal is asserted;
(2) if VPP is greater than 4V, then the VPP4V signal is asserted; and
(3) if VPP is greater than 9V, then the VPP9V signal is asserted.

The DETECT circuit is only operable when enabled by the V5VEN signal. Details of the DETECT circuit are described in reference to FIGS. 2A–2C.

The SMART circuit decodes the VCC4V, VPP4V and VPP9V signals provided by the DETECT circuit to determine which of the power supplies to use to generate the 5V signal. The SMART circuit generates three signals, HALFVPP, USEVPP and ERRVPP. If VCC is not greater than 4V and VPP is greater than 9V, then the SMART circuit asserts the HALFVPP signal, indicating that the 5V supply V5V should be generated from half of VPP. If VCC is not greater than 4V, VPP is not greater than 9V and VPP is greater than 4V, then the USEVPP signal is asserted, indicating that the 5V supply should be generated directly from VPP. If VCC is greater than 4V, then the SMART circuit asserts none of the outputs, indicating that the 5V supply V5V is generated directly from VCC (i.e., there is no USEVCC signal. Finally, if none of the VCC4V, VPP4V and VPP9V signals are asserted, then the ERRVPP signal is asserted, indicating that both VCC and VPP are smaller than 4V and that no 5V supply will be generated. Details of the SMART block are described in reference to FIG. 3.

The USEVPP and VCC4V signals are coupled to a pump module (VCCVPPON), which, if the USEVPP or VCC4V signals are asserted, pumps the corresponding power supply signal to above 7V. For example, if USEVPP is high, then the VCCVPPON circuit generates a pumped VPPON signal that is higher than 7V. If VCC4V is high, then a pumped VCCON signal is provided that is higher than 7V. Each pumped signal is generated by a respective pump circuit that is driven by a two phase clock XC1, XC2. Details of the VCCVPON block are described in reference to FIGS. 4A–4D.

The HALFVPP signal is coupled to a VPPCNTL module that comprises a transistor-based voltage divider that generates an output power signal VPPCNTL that is approximately half of VPP. Details of the HALFVPP block are described in reference to FIG. 5.

The VPPCNTL, VCCON and VPPON signals are coupled to a switch V5V that generates the 5V output V5V from whichever of the inputs signals are asserted. Due to the structure of the switch V5V:

(1) When VCCON is used, the output V5V is approximately at VCC (because VCCON is much higher than VCC);
(2) When VPPON is used, the output V5V is approximately at VPP (because VPPON is much higher than VPP); and
(3) When VPPCNTL is used, the output V5V is established at VPPCNTL minus a transistor threshold.

Figure 2:
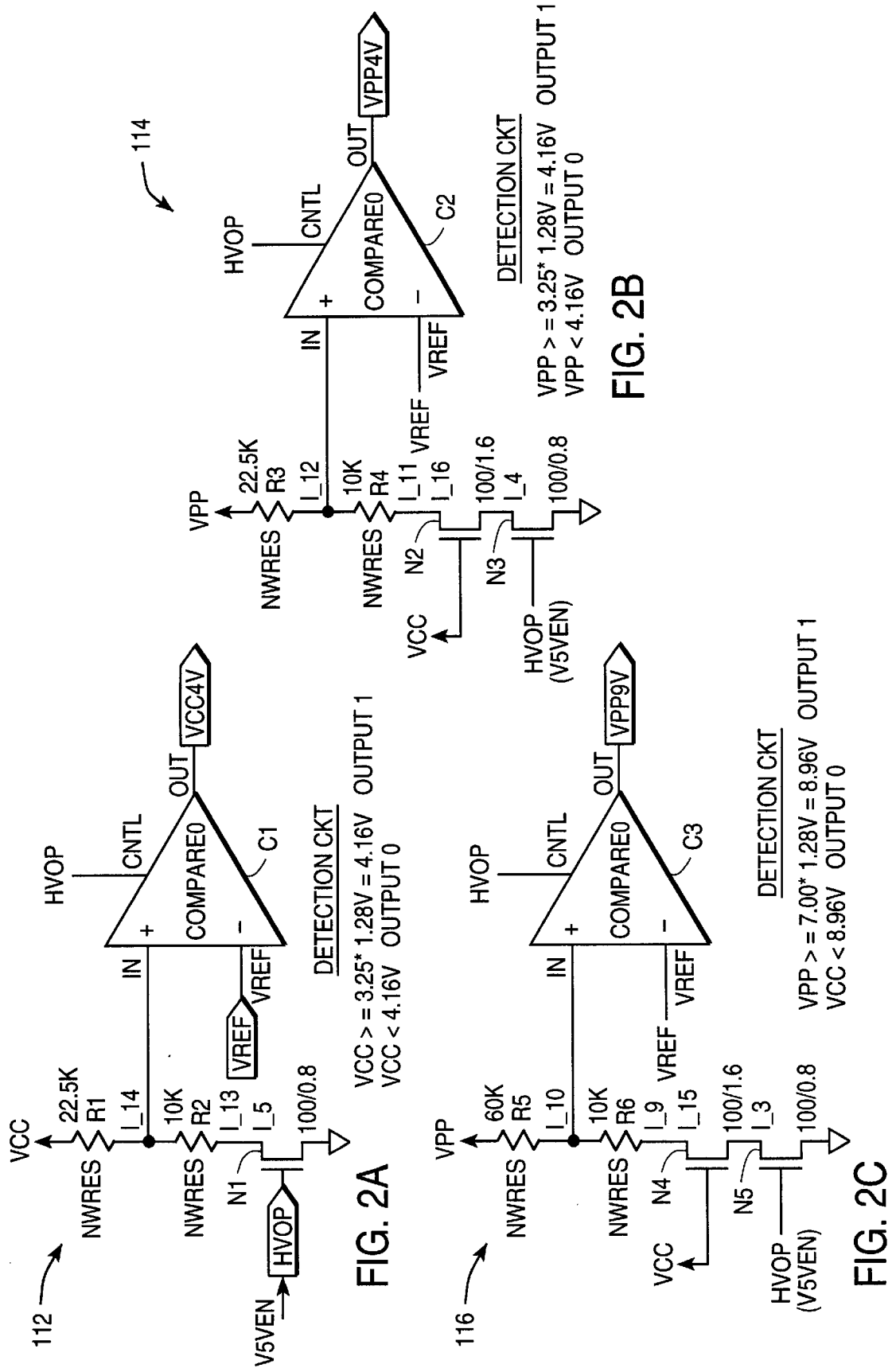
FIG. 2A is a circuit schematic of a portion of the detector block (DETECT) of FIG. 1 that detects whether the VCC level is greater than approximately 4V.
FIG. 2B is a circuit schematic of a portion of the DETECT block of FIG. 1 that detects whether the VPP level is greater than approximately 4V.
FIG. 2C is a circuit schematic of a portion of the DETECT block of FIG. 1 that detects whether the VPP level is greater than approximately 9V.

Referring to FIG. 2A, there is shown a circuit schematic of a portion 112 of the detector block (DETECT) of FIG. 1 that detects whether the VCC level is greater than approximately 4V. Inputs to this circuit include V5VEN, coupled to an HVOP pin, VCC and VREF. The output is the VCC4V signal. The circuit 112 includes a comparator C1, an n-channel pulldown transistor N1, and two resistors R1, R2. The transistor N1 has a gate, source and drain coupled respectively to the V5VEN signal, the ground node, and one terminal of the resistor R2. The resistors R1 and R2 form a voltage divider that biases the voltage at the non-inverting input of the comparator C1 to some fraction of the VCC voltage level. In the preferred embodiment, the resistors R1 and R2 have respective values of 22.5K and 10K. As a result, when it is enabled by the V5VEN signal the comparator C1 generates a high VCC4V signal if the VCC signal is greater than VREF×3.25 and, otherwise, generates a low VCC signal. Assuming that the VREF signal is at 1.28V, a high VCC4V signal corresponds to VCC>4.16V.

Referring to FIG. 2B, there is shown a circuit schematic of a portion 114 of the detector block (DETECT) of FIG. 1 that detects whether the VPP level is greater than approximately 4V. Inputs to the circuit 114 include V5VEN, coupled to the HVOP pin, VCC and VREF. The output is the VPP4V signal. The circuit 114 includes a comparator C2, two n-channel pulldown transistors N2, N3 and two resistors R3, R4. The circuit 114 operates similarly to the circuit 112. One difference is that the circuit 114 uses two pulldown transistors N2, N3 instead of one. The transistor N3, which has a gate coupled to the V5VEN signal, enables the operation of circuit 114, much like the transistor N1 of FIG. 2A. The transistor N2 isolates high VPP voltages from the transistor N3 to avoid breakdown of the transistor N3 when that transistor has a high drain to source voltage (Vds). As a result, the comparator C2 generates a high VPP4V signal when the VPP signal is greater than VREF×3.25 and, otherwise, generates a low VPP4V signal. Assuming that the VREF signal is at 1.28V, a high VPP4V signal corresponds to VPP>4.16V.

Referring to FIG. 2C, there is shown a circuit schematic of a portion 116 of the detector block (DETECT) of FIG. 1 that detects whether the VPP level is greater than approximately 9V. Inputs to the circuit 116 include V5VEN, coupled to the HVOP pin, VCC and VREF. The output is the VPP9V signal. The circuit 116 includes a comparator C3, two n-channel pulldown transistors N4, N5 and two resistors R5, R6. The circuit 116 operates similarly to the circuit 114. One difference is that the resistors R5 and R6 have resistances of 60KΩ and 10KΩ, respectively. As a result, the comparator C3 generates a high VPP9V signal when the VPP signal is greater than VREF×7.0; otherwise, it generates a low VPP9V signal. Assuming that the VREF signal is at 1.28V, the high VPP9V signals correspond to VPP>8.96V.

Figure 3:
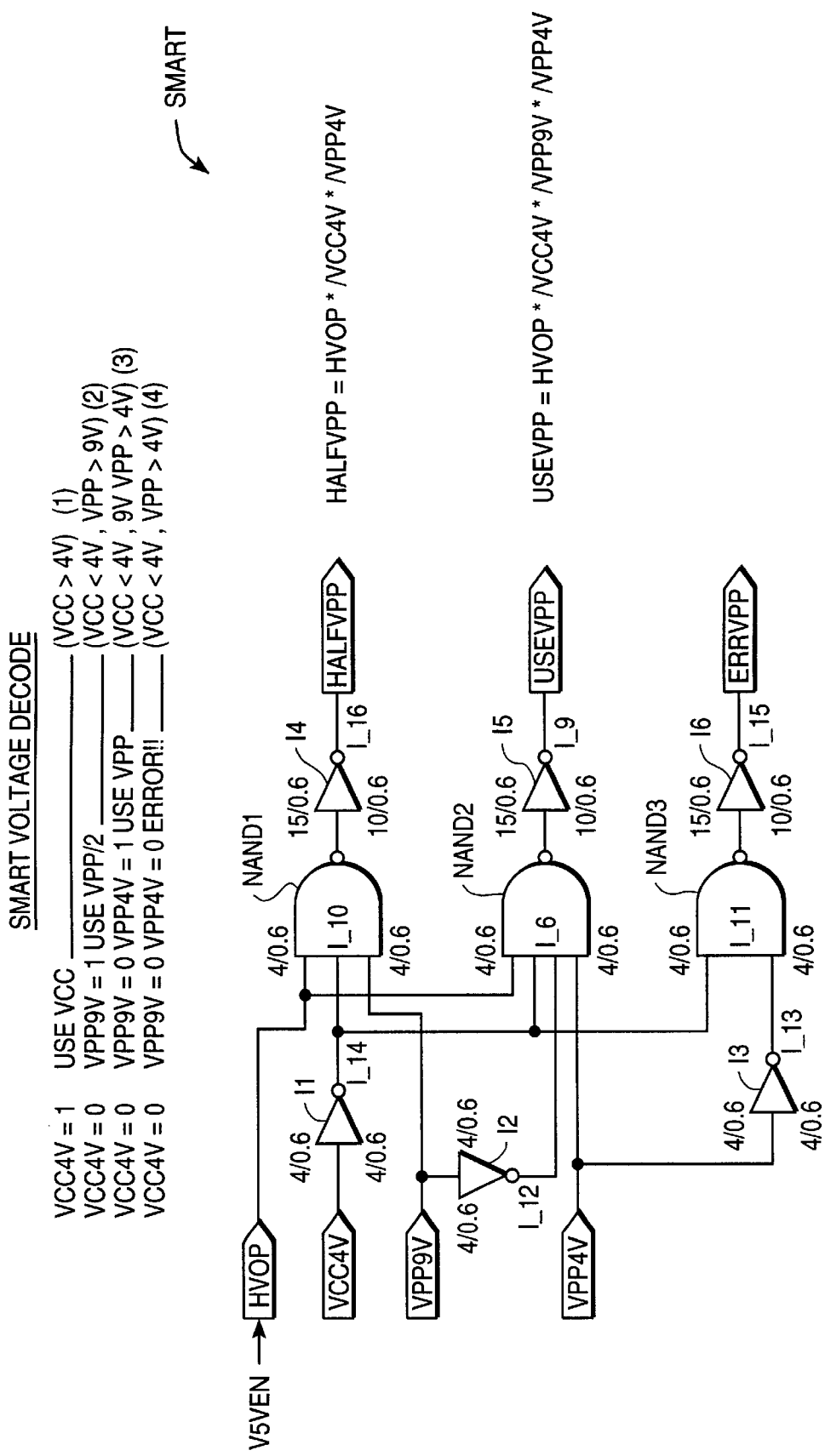
FIG. 3 is a circuit schematic of the smart voltage decoder block (SMART) of FIG. 1 that asserts control signals that indicate whether the 5V signal is to be generated from VCC, VPP, half of VPP or not at all.

Referring to FIG. 3, there is shown a circuit schematic of the smart voltage decoder block (SMART) of FIG. 1 that asserts control signals that indicate whether the 5V signal is to be generated from VCC, VPP, half of VPP or not at all. Inputs to the SMART circuit include the V5VEN signal, again provided at the HVOP pin, and the VCC4V, VPP4V and VPP9V signals. Based on these four inputs, the SMART circuit generates three output signals, HALFVPP, USEVPP and ERRVPP. The SMART circuit includes six inverters I1–I6 and three NAND gates NAND1–NAND3.

The NAND1 gate has three inputs respectively coupled to the V5VEN, inverted VCC4V and VPP9V signals. The output of the NAND1 gate is coupled to the inverter I4. Consequently, the NAND1 gate generates a high HALFVPP output when the V5VEN signal is high, the VCC4V signal is low and the VPP9V signal is high. The HALFVPP signal indicates when high that the V5V output signal should be generated from half of the VPP signal, which is approximately 12V (i.e., between 10.8V and 13.2V).

The NAND2 gate has four inputs respectively coupled to the V5VEN, inverted VCC4V, inverted VPP9V and VPP4V signals. The output of the NAND2 gate is coupled to the inverter I5. Consequently, the NAND2 gate generates a high USEVPP output when the V5VEN signal is high, the VCC4V signal is low, the VPP9V signal is low and the VPP4V signal is high. The USEVPP signal indicates when high that the V5V output signal should be generated from the VPP signal, which is approximately 5V (i.e., between 4.5V and 5.5V).

The NAND3 gate has two inputs respectively coupled to the inverted VCC4V and VPP4V signals. The output of the NAND3 gate is coupled to the inverter I6. Consequently, the NAND3 gate generates a high ERRVPP output when both of the VCC4V and VPP4V signals are low. That is, the ERRVPP signal indicates when high that the V5V output signal cannot be generated from the VPP or VCC signals, both of which are less than approximately 4V.

Referring to FIG. 4A, there is shown a circuit schematic of a portion 120 of the local VPP switching block (VCCVPPON) of FIG. 1 that generates the two phase clock signals XC1 and XC2 in response to the external clock control signal CLK40N. The circuit 120 includes two NOR gates NOR1 and NOR2 and inverters I7–I20 that are coupled in the conventional manner to generate a two-phase clock. The CLK40N signal is coupled to one input of the NOR1 gate and the inverter I18, whose output is coupled to one input of the NOR2 gate. The other inputs of the NOR1 and NOR2 gates are coupled respectively to the clock signals XC2 and XC1 via matched inverter chains that provide the delay necessary to generate the two nonoverlapping clock signals XC1, XC2. When the CLK40N signal is low, the XC1 signal is high and the XC2 signal is low. When the CLK40N signal makes a low to high transition, the XC1 signal becomes low and the delay chain I13,I12, I10,I9 causes the XC2 signal to go high with some delay (set by the four inverters) after the XC1 signal goes low. The delay chain I17, I16, I15, I14 operates in a similar manner to cause the XC1 signal to go high with the same delay after the XC2 signal goes low. This operation provides the non-overlapping clock signals XC1, XC2.

The XC1 and XC2 clock signals are input to circuitry 122 that generates a gated set of two-phase clock signals XCC1/XCC2 or XCP1/XCP2 that are used by pump circuits 124 (shown in FIG. 4C) or 126 (shown in FIG. 4D), respectively. Other inputs to the circuitry 122 include the VCC4V and USEVPP signals. When the VCC4V signal is asserted, the upper portion 122-1 generates XCC1 and XCC2 clock signals that correspond to the clock signals XC1 and XC2. When the USEVPP signal is asserted, the lower portion 122-2 generates XCP1 and XCP2 clock signals that correspond to the clock signals XC1 and XC2. FIG. 4C is a circuit schematic of the VCC charge pump 124 that generates a VCCON signal that is coupled to the 5V output signal V5V when the V5V signal is generated from VCC. Inputs to the charge pump 124 include the VCC4V, VCC, XCC1 and XCC2 signals. The VCC charge pump 124 includes a p-channel transistor P1, native mode transistors Z1, Z2 and Z3 and n-channel transistors N6 and N7 connected in series between the VCC node and the ground node. The VCC charge pump 124 also includes MOS capacitors MC1 and MC2 whose drains and sources are respectively coupled to the XCC1 and XCC2 signals. The gates of the MOS capacitors MC1 and MC2 are respectively coupled to the drains and gates of the transistors Z2 and Z3, respectively. The drains and gates of the native-mode transistor Z1 are also interconnected. This causes the native-mode transistors Z1–Z3 to remain on as long as the transistor P1 is on. The gate of the transistor N6 is coupled to VCC. The VCC4V signal is inverted by an inverter I21 and the inverted signal is tied to the gates of the transistors P1 and N7.

When the VCC4V signal is low, the transistor N7 is on and the transistor P1 is off. This causes the VCCON signal to be pulled down to ground. When the VCC4V signal is high, the transistor P1 is on, the transistor N7 is off and the VCCON signal is steadily pumped up to a voltage level higher than 7V. The pumping action is conventional and consists in each of the MOS capacitors MC storing charge when its respective clock signal XCC makes a low to high transition and discharging when the same XCC signal makes a high to low transition. The charge stored by the capacitors and therefore the VCCON signal voltage generally increases up to the target voltage because, during high to low transitions of the clock signals, a portion of the lost, stored charge is replaced by charge contributed by the VCC node. As a result, the VCCON signal voltage does not drop for a given clock cycle as much as it increased for the same cycle.

FIG. 4D is a circuit schematic of the VPP charge pump 126 that generates a VPPON signal that is coupled to the 5V output signal V5V when the V5V signal is be generated from VPP. Inputs to the charge pump 124 include the USEVPP, VCC, XCP1 and XCP2 signals. The operation of the charge pump 126 is sufficiently similar to that of the charge pump 124 that is not described herein. The final VPPON voltage is given by the following expression:

$$VPPON = VCC + (2)(.9)VCC - 3Vtz$$
$$= VCC + 1.8VCC - 3VTz$$
$$> 7V$$

In this expression Vtz represents the threshold voltage of the native-mode transistors and the 0.9 VCC factor represents the amount the VPPON voltage is boosted by the capacitors' pumping action.

Referring to FIG. 5, there is shown a circuit schematic of the VPP control block (VPPCNTL) of FIG. 1 that generates a VPPCNTL signal at approximately half of VPP when the HALFVPP control signal is asserted. The VPPCNTL circuit includes p-channel transistors P2–P8, n-channel transistors N8–N14, native-mode transistors Z4, Z5 and an inverter I22, connected as shown in FIG. 5. The circuits 140 and 142 and the transistor Z4 function like an inverting voltage shifter, generating from the signal HALFVPP, which is between ground and VCC, a voltage signal $V_{150}$ at the node 150 that is between ground and VPP. The circuit 144 is a voltage divider, which is turned on or off by the circuits 140 and 142. The different operational modes of the VPPCNTL circuit are now described.

When the HALFVPP signal is high, the level of the VPPCNTL output is determined by the circuits 140, 142 and 144. For these conditions, the output of the transistor Z4 is high and the transistors N8, N9 pull the voltage at node 148 ($V_{148}$) lower while the transistors P2, P3 pull the voltage at node 146 ($V_{146}$) higher. This causes the voltages $V_{148}$ and $V_{150}$ to be at ground. The node 150 is coupled to the gate of the transistor P2, which is part of the circuit 140, and the gate of the transistor P6, which is part of the voltage divider 144. As long as $V_{150}$ is more than a threshold drop below the level of the VPP signal, the transistor P2 remains active. When this is the case, the transistor P2 exerts an upward pull on the voltage $V_{146}$. The strength of this pull is inversely related to the level of the voltage $V_{150}$.

As the voltage at the node 146 increases, the n-channel transistor N9 turns on more strongly and the p-channel transistor P4 becomes weaker. This increases the effective resistance of the transistor P4, which causes $V_{150}$ to drop and turn on the transistor P6 and, in turn, $V_{146}$ to rise. Eventually, the circuits 140, 142 establish $V_{150}$ at ground, which enables the voltage divider network 144 to establish the level of the VPPCNTL signal as follows:

VPPCNTL=VPP/2+Vtn+Vtz2.

In this expression Vtn and Vtz represent the thresholds of the n-channel and native-mode devices, respectively.

As mentioned above, the gate of the transistor P6 is coupled to node 150. Consequently, the level of $V_{150}$ determines the current that flows in the voltage divider 144. The sizes of the divider elements P6, P7, P8, Z5, N10, N11 and N12 are selected in a conventional manner so that each element has a respective resistance, which, given the programmed voltage divider current, produces the VPPCNTL signal at the level defined above.

The HALFVPP signal is also coupled to the input of the inverter I22 as well as the gate of the transistor N9 via the pass transistor Z4. The output of the inverter I22 is coupled to the gate of the transistor N14, whose drain is coupled to the source of the transistor N13, which isolates the high voltage of the VPPCNTL signal from the transistor N14, preventing a high $V_{DS}$ breakdown of the transistor N14. The drain of the transistor N13 is coupled to the output signal VPPCNTL.

The transistors N13, N14 compose a pulldown circuit 160 that, when the HALFVPP signal is low, couples the output signal VPPCNTL to the ground node so as to produce a low VPPCNTL signal. At the same time the gate of the transistor N9 is grounded, which allows the p-channel transistors P4, P5 to pull $V_{150}$ up to VPP, deactivating both the circuit 140 and the voltage divider circuit 144.

When the HALFVPP signal is high, the pulldown transistor N14 is off, which disables the pulldown circuit 160 and enables the circuits 140, 142 and 144 to produce a VPPCNTL signal that is approximately half of VPP.

Figure 6:
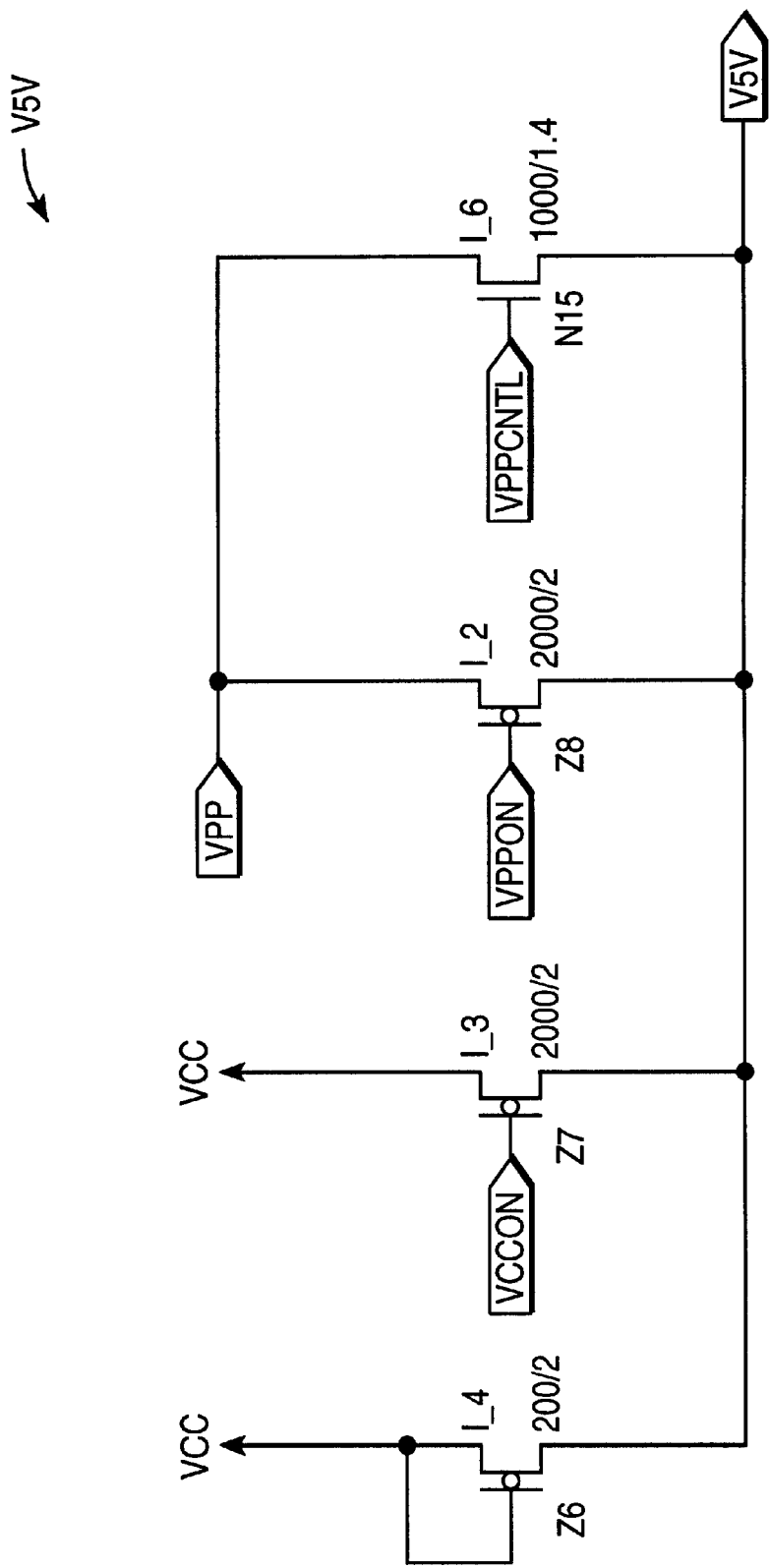
FIG. 6 is a circuit schematic of the output switching block (V5V) of FIG. 1 that provides the 5V signal.

Referring to FIG. 6, there is shown a circuit schematic of the output switching block V5V of FIG. 1 that provides the 5V signal V5V. The output switching block includes native-mode transistors Z6–Z8 and an n-channel transistor N15. The sources of these transistors are coupled to the V5V output signal. The gate and source of the transistor Z6 are coupled to the VCC node. The transistor Z7 has a gate and drain coupled respectively to the VCCON signal and the VCC node. The transistor Z8 has a gate and drain coupled respectively to the VPPON signal and the VPP node. The transistor N15 has a gate coupled to the VPPCNTL signal and a drain coupled to the VPP signal.

Only one of the VCCON, VPPON and VPPCNTL signals is asserted at any given time. That is, when the V5V signal is to be generated from VCC, VPP or half VPP, the signals VCCON, VPPON and VPPCNTL are asserted, respectively. In the error condition, none of the signals VCCON, VPPON and VPPCNTL are asserted.

When the VCCON signal is asserted, the 5V output signal V5V is close to VCC because VCCON is pumped to a much higher level than VCC. When the VPPON signal is asserted, the V5V signal is close to VPP, because VPPON is pumped to a much higher level than VPP. When the VPPCNTL signal is asserted, the V5V signal is established at VPPCNTL less the threshold voltage of the n-channel transistor N15. In the error condition, when none of the signals VCCON, VPPON and VPPCNTL are asserted, the V5V signal is established at VCC less the threshold of the transistor Z6. As the transistors Z6–Z7 are native-mode devices, their thresholds are near 0V.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A smart voltage generator circuit for use in an integrated circuit having a plurality of power supply signals, including VCC and VPP signals, the voltage generator circuit comprising:

a voltage detection circuit configured to detect the voltage levels of the VCC and VPP signals and to generate a plurality of detection signals that indicate which of the power supply signals should be used to generate an output voltage signal at approximately a predetermined voltage level; and an output switch that generates said output voltage signal approximately at said predetermined voltage level, the output switch generating the output voltage signal from (A) the VCC signal when a first one of the detection signals is enabled, (B) the VPP signal when a second one of the detection signals is enabled, and (C) the VPP signal gated by a first internally generated signal when a third one of the detection signals is enabled, the first internally generated signal having a voltage level less than the voltage level of the VPP signal.

2. The smart voltage generator circuit of claim 1, including a voltage divider circuit having as inputs the VPP signal and the third detection signal and an output of the first internally generated signal, wherein operation of the voltage divider circuit is disabled when the third detection signal is not enabled.

3. The smart voltage generator circuit of claim 2, wherein when the third detection signal is not enabled, the voltage divider circuit couples the first internally generated signal to a circuit ground when the third detection signal is not enabled.

4. The smart voltage generator circuit of claim 3, wherein when the third detection signal is enabled, the voltage divider circuit couples to the first internally generated signal a signal having a voltage level corresponding to a predefined fraction of the voltage level of the VPP signal.

5. The smart voltage generator circuit of claim 3, wherein the output switch includes a first MOS transistor having a gate coupled to the first internally generated signal, the first MOS transistor coupling the VPP signal to the output voltage signal when (A) the first internally generated signal is not coupled to the circuit ground and (B) a voltage differential between the first internally generated signal and the output voltage signal is greater than a threshold voltage associated with the first MOS transistor.

6. The smart voltage generator circuit of claim 5, including:
   a first charge pump circuit for generating a first voltage boosted signal from the VCC signal when the first detection signal is enabled;
   a second charge pump circuit for generating a second voltage boosted signal from the VCC signal when the second detection signal is enabled;
   wherein the output switch includes:
      a second MOS transistor having a gate coupled to the first voltage boosted signal, the second MOS transistor coupling the VCC signal to the output voltage signal when the first detection signal is enabled; and
      a third MOS transistor having a gate coupled to the second voltage boosted signal, the third MOS transistor coupling the VPP signal to the output voltage signal when the second detection signal is enabled.

7. The smart voltage generator circuit of claim 1, wherein the output switch includes a first MOS transistor having a gate coupled to the first internally generated signal, the first MOS transistor coupling the VPP signal to the output voltage signal when (A) the first internally generated signal is not coupled to the circuit ground and (B) a voltage differential between the first internally generated signal and the output voltage signal is greater than a threshold voltage associated with the first MOS transistor.

8. The smart voltage generator circuit of claim 7, including:
   a first charge pump circuit for generating a first voltage boosted signal from the VCC signal when the first detection signal is enabled;
   a second charge pump circuit for generating a second voltage boosted signal from the VCC signal when the second detection signal is enabled;
   wherein the output switch includes:
      a second MOS transistor having a gate coupled to the first voltage boosted signal, the second MOS transistor coupling the VCC signal to the output voltage signal when the first detection signal is enabled; and
      a third MOS transistor having a gate coupled to the second voltage boosted signal, the third MOS transistor coupling the VPP signal to the output voltage signal when the second detection signal is enabled.

9. The smart voltage generator circuit of claim 1, including:
   a first charge pump circuit for generating a first voltage boosted signal from the VCC signal when the first detection signal is enabled;
   a second charge pump circuit for generating a second voltage boosted signal from the VCC signal when the second detection signal is enabled;
   wherein the output switch includes:
      a first MOS transistor having a gate coupled to the first internally generated signal, the first MOS transistor coupling the VPP signal to the output voltage signal when the third detection signal is enabled;
      a second MOS transistor having a gate coupled to the first voltage boosted signal, the second MOS transistor coupling the VCC signal to the output voltage signal when the first detection signal is enabled; and
      a third MOS transistor having a gate coupled to the second internally boosted signal, the third MOS transistor coupling the VPP signal to the output voltage signal when the second detection signal is enabled.

10. The smart voltage generator circuit of claim 1, wherein the voltage detection circuit is configured:
   (A) to enable the first detection signal when the voltage level of the VCC signal exceeds a predefined minimum VCC level,
   (B) to enable the second detection signal when the voltage level of the VCC signal does not exceed the predefined minimum VCC level, and the voltage level of the VPP signal is greater than a predefined first minimum VPP level and less than a predefined second minimum VPP level; and
   (C) to enable the third detection signal when the voltage level of the VCC signal does not exceed the predefined minimum VCC level, and the voltage level of the VPP signal exceeds the predefined second minimum VPP level.

11. A smart voltage generator circuit for use in an integrated circuit having a plurality of power supply signals, including VCC and VPP signals, the voltage generator circuit comprising:
   a voltage detection circuit configured to detect the voltage levels of the VCC and VPP signals and to generate a plurality of detection signals that indicate which of the power supply signals should be used to generate an output voltage signal at approximately a predetermined voltage level;
   an output switch that generates said output voltage signal approximately at said Predetermined voltage level, the output switch generating the output voltage signal from (A) the VCC signal when a first one of the detection signals is enabled, and (B) the VPP signal when a second one of the detection signals is enabled;
   a first charge pump circuit for generating a first voltage boosted signal from the VCC signal when the first detection signal is enabled;
   a second charge pump circuit for generating a second voltage boosted signal from the VCC signal when the second detection signal is enabled;
   wherein the output switch includes:
      a first MOS transistor having a gate coupled to the first voltage boosted signal, the second MOS transistor coupling the VCC signal to the output voltage signal when the first detection signal is enabled; and
      a second MOS transistor having a gate coupled to the second voltage boosted signal, the third MOS transistor coupling the VPP signal to the output voltage signal when the second detection signal is enabled.

* * * * *